(12) United States Patent
Mucha

(10) Patent No.: US 6,207,570 B1
(45) Date of Patent: Mar. 27, 2001

(54) METHOD OF MANUFACTURING INTEGRATED CIRCUIT DEVICES

(75) Inventor: John Aaron Mucha, Austin, TX (US)

(73) Assignee: Lucent Technologies, Inc., Murray Hill, NJ (US)

(*) Notice: Subject to any disclaimer, the term of this patent is extended or adjusted under 35 U.S.C. 154(b) by 0 days.

(21) Appl. No.: 09/378,250

(22) Filed: Aug. 20, 1999

(51) Int. Cl.[7] ................................................ H01L 21/302
(52) U.S. Cl. ...................... 438/692; 438/724; 438/744; 438/745
(58) Field of Search ........................... 438/8, 9, 14, 16, 438/692, 697, 723, 724, 743, 744, 745, 756, 757; 216/79, 84, 85

(56) References Cited

U.S. PATENT DOCUMENTS

| | | |
|---|---|---|
| 4,498,953 | 2/1985 | Cook et al. . |
| 4,992,137 | 2/1991 | Cathey, Jr. et al. . |
| 5,425,842 | 6/1995 | Zijlstra . |
| 5,514,247 | 5/1996 | Shan et al. . |
| 5,637,534 | 6/1997 | Takeyasu et al. . |
| 5,849,639 | 12/1998 | Molloy et al. . |
| 6,001,730 | * 12/1999 | Farkas et al. .................... 438/692 X |
| 6,048,796 | * 4/2000 | Wang et al. ........................ 438/692 |
| 6,083,835 | * 7/2000 | Shue et al. ....................... 438/692 X |
| 6,117,782 | * 9/2000 | Lukanc et al. ...................... 438/692 |

OTHER PUBLICATIONS

Ibbotson et al. *Selective Interhalogen Etching of Tantalum Compounds and Other Semiconductor Materials*, Appt. Phys. Lett. 46(8), Apr. 15, 1985, pp. 794–796.

Science and Technology of Semiconductor Surface Preparation, Symposium held Apr. 1–3, 1997, San Francisco, CA, Materials Research Society Symposium Proceedings vol. 477, Pittsburgh, PA, pp. 145–157.

* cited by examiner

Primary Examiner—William Powell
(74) Attorney, Agent, or Firm—Schnader Harrison; Segal and Lewis LLP

(57) ABSTRACT

A method for manufacturing integrated circuit apparatuses; particularly, 1) a method for removing barrier material that lies between copper conductors in damascene interconnections, and 2) a method for removing a thin layer of silicon nitride material that has been intentionally un-etched during the formation of trenches and vias in damascene interconnect dielectric and thereby not exposing copper metal.

35 Claims, 3 Drawing Sheets

METHOD OF MANUFACTURING INTEGRATED CIRCUIT DEVICES

BACKGROUND OF THE INVENTION

1. Field of the Invention

This invention relates to a method of manufacturing semiconductor integrated circuit interconnect structures. The invention relates more particularly to 1) a method for removing barrier material that lies between copper conductors in damascene interconnections, and 2) a method for removing a thin layer (<200 Angstroms) of silicon nitride material that has been intentionally un-etched during the formation of trenches and vias in interconnect dielectric and thereby not exposing copper metal.

2. Background of the Invention

Semiconductor integrated circuit devices, or apparatuses, typically comprise silicon and multiple layers of vertically stacked metal interconnect layers with dielectric materials disposed between them. The fabrication of such apparatuses typically involves the repeated deposition or growth, patterning, and etching of thin films of semiconductor, metal, and dielectric materials.

Current interconnect processing uses metal etching to define the conductors and dielectric etching to define the vias. In future damascene interconnect processing, for which this invention is primarily intended, dielectric etching will be used to define both conductors and vias. The following discussion of dielectric etching also applies to metal etching used to define conductors.

A via or trench pattern etched into a single layer of dielectric that will be filled with a conducting metal material is known as a single damascene, and a "double" layer of dielectric containing a trench above a via that will be filled with a conducting metal material is known as a dual damascene. For example, a single damascene structure is shown in FIG. 1 and a dual damascene structure is shown in FIG. 2. In FIGS. 1 and 2, during semiconductor fabrication, an etch-stop SiN layer 5 and 14, respectively, is commonly used at the bottom of an etched low-k structure 3 and 12, respectively, to prevent breakthrough to an underlying copper region 8 and 17, respectively, and to permit over-etching to account for etch non-uniformity. When the exposed nitride layer 7 and 16 is finally plasma or RIE etched to expose copper region 8 and 17, electrical damage to the gate can occur. There is also a tendency to sputter copper 8 and 17 onto adjacent areas of dielectric 4 and 13 that is not yet protected by barrier material.

For brevity, the remaining background involves only the single damascene structure of FIGS. 3, 4, and 5 after etching the structure of FIG. 1. As shown in FIG. 3, the sputtered copper 18 on the sidewall of low-k dielectric 4 can lead to leakage. Wet cleaning processes may be employed, but there is a tendency for the low-k dielectric 4 to absorb moisture, which can affect apparatus performance. Additionally, as wiring dimensions shrink to less than 0.2 µm, cleaning the bottom of high aspect ratio features becomes less efficient. After cleaning, the etched dielectric structure 3 that is formed, as shown in FIG. 4, is coated with a thin layer of barrier material 19 and the structure 3 is filled with copper metal 20. The barrier material 19 between copper 20 and cap 2 is intended to prevent diffusion of copper into dielectric 4 and cap 2, which can cause undesirable leakage between conductors. Copper 20 and barrier material 19 are polished and/or planarized and removed back to the cap 2. Chemical mechanical polishing (CMP) is preferred to ideally form a polished, planar surface consisting essentially of copper metal areas isolated from each other by dielectric material. This structure is then ready for dielectric depositions for the next interconnect layer (via or via and trench). In practice, chemical mechanical polishing does not lead to an acceptable planar surface.

As chemical mechanical polishing proceeds, copper 20 is removed until the top surface barrier material 11 is exposed. Since the chemical and mechanical properties of barrier material and copper differ, copper is more easily removed than the harder, more chemically inert barrier material resulting in inconsistent removal of the two materials. Thus, a slight "dishing" 50 of copper 20 occurs, as shown in FIG. 5. Since the barrier material 19 is also somewhat conducting, failure to completely remove it leads to barrier contamination 52 that can cause electrical leakage between copper conductors. In addition to leakage, chemical mechanical polishing of barrier material tends to magnify erosion and dishing of features, which introduces undesirable topography that is amplified as more layers are completed. This ultimately affects critical lithography steps in the upper layers. A highly selective dry process for removal of barrier material and etch-stop SiN after the low-k etch, once copper is removed, would be an effective method of minimizing the problems of copper sputtering, barrier contamination, dishing, and erosion.

A method is known for plasma etching of vias in which back sputtered metal residue on the walls of vias is removed during the dielectric etch. In this process, a gas capable of forming volatile compounds with the underlying metal is added to the fluorine-bearing gases. The volatile compounds are then easily evacuable. The "metal-scavenging" gases used in the process are gases such as $Cl_{2, HCl2}$, $Br_2$, HBr and $BCl_3$.

A method is known for removing etching residues by applying to the substrate surface a mixture of gases such as oxygen, nitrogen, fluorine, hydrofluorocarbon and fluorinated methane and amine gases to remove the photoresist layers and make the etching residues water-soluble. The residues are then rinsed away with deionized water.

A method is known for preventing etching residue deposits by stopping the injection of reactive gases to a dry etching reactor when the etch is nearly completed, while maintaining power to the reactor. The gases in the reactor are maintained in a plasma state. The reactive gas is then evacuated from the reactor before decreasing the power to the reactor. This process prevents the deposition of residue which forms from the etchant materials after power to the reactor is shut off when etchant byproducts are no longer receiving excitation from plasma state electron collisions.

A method is known for manufacturing a semiconductor apparatus in an atmosphere having a carbonless, chlorine-based gas or a mixture of a carbonless, chlorine-based gas and an inactive gas in order to remove contaminant which would promote reactivity with aluminum chemical gas deposition on the surface of the insulating layer.

A method is known for selectively etching a first region comprised of silicon, tantalum, tantalum silicide and tantalum nitride, relative to a second region comprised of tantalum oxide or silicon dioxide, where a polyatomic halogen fluoride vapor is used in the substantial absence of plasma. The polyatomic halogen fluoride is either $BrF_5$, $BrF_3$, $ClF_3$, or $IF_5$.

A method has been described, wherein polyatomic halogen fluorides were found to be effective and selective etchants for a variety of transition metals and metal compounds. In particular, $ClF_3$ is economically desired for the etching.

SUMMARY OF THE INVENTION

One aspect of the invention is a method of manufacturing an integrated circuit including the steps of: (1) providing an apparatus having a plurality of exposed metal-conducting regions adjacent to a plurality of dielectric regions, covered at least partially with a barrier material; (2) subjecting the apparatus to a reducing gas to reduce metal oxide on the metal-conducting regions to metal; (3) contacting the barrier material with $XeF_2$ to remove selected portions of the barrier material; (4) exposing the apparatus to a reducing gas to transform residual metal oxide and fluoride to metal at contacted surfaces; and preferably, (5) chemical mechanical polishing, or planarizing, portions of the metal-conducting regions that protrude beyond the adjacent dielectric regions to complete planarization after the barrier material has been removed. This etching method may be used to remove undesired barrier material after chemical mechanical polishing, or planarizing, of the metal to eliminate electrical leakage, minimize dishing and erosion of metal, and prevent polishing damage to the hard mask, or cap, that effects the critical dimension of the feature.

In another aspect of the invention, there is a method of manufacturing an integrated circuit including the steps of: (1) providing an apparatus comprising a substrate having a metal-conducting region deposited thereon, an SiN layer deposited above the metal-conducting region, and a dielectric region, having a via formed therein, deposited on the SiN layer, wherein a portion of the SiN layer below the via has a thickness less than about 200 ÅA; (2) contacting the SiN layer with a gas selected from the group consisting of inter-halogen gas, rare-gas halide gas, and mixtures thereof to remove the SiN layer and expose the metal-conducting region, thereby avoiding subsequent redeposition of metal from the metal-conducting region onto portions of the dielectric region and preventing electrical leakage in the apparatus; and (3) exposing the apparatus to a reducing gas to transform residual metal oxide and fluoride to metal at contacted surfaces. This etching method may be used to remove the residual nitride without allowing contact of the copper to plasma ion bombardment and thereby minimizing plasma charging damage of gate dielectric and avoiding copper redeposition on the sidewall.

DETAILED DESCRIPTION

The invention will be understood more fully from the detailed description given below, which however, should not be taken to limit the invention to a specific embodiment, but is for explanation and understanding only.

Figure 1:
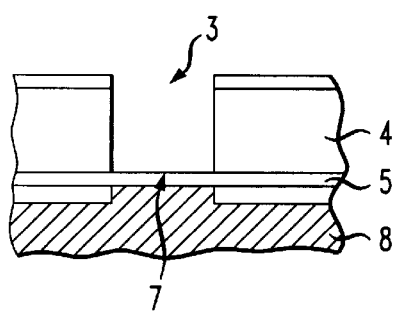
FIG. 1 is a cross-sectional view of a portion of a single damascene of the prior art.
Figure 2:
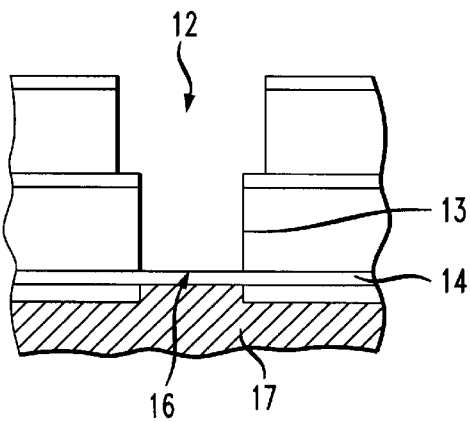
FIG. 2 is a cross-sectional view of a portion of a dual damascene of the prior art.
Figure 3:
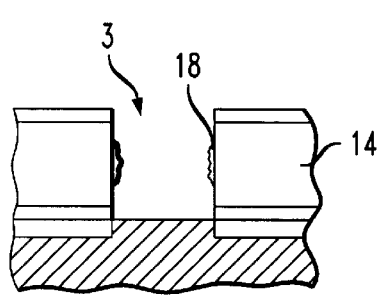
FIGS. 3 is a cross-sectional view of the portion of a single damascene of FIG. 1, having sputtered material.
Figure 4:
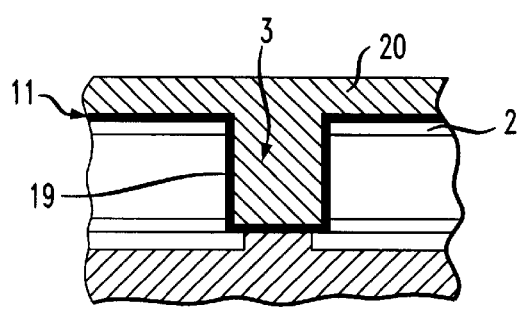
FIGS. 4 is a cross-sectional view of the portion of a single damascene of FIG. 1 after deposition of a barrier material layer and metal.
Figure 5:
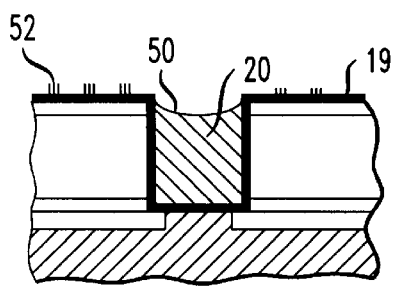
FIG. 5 is a cross-sectional view of the portion of a single damascene of FIG. 1 having dishing and barrier contamination.
Figure 6:
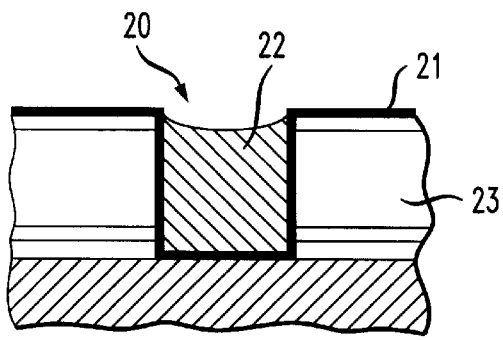
FIG. 6 is a cross-sectional view of a portion of a single damascene with barrier material.
Figure 7:
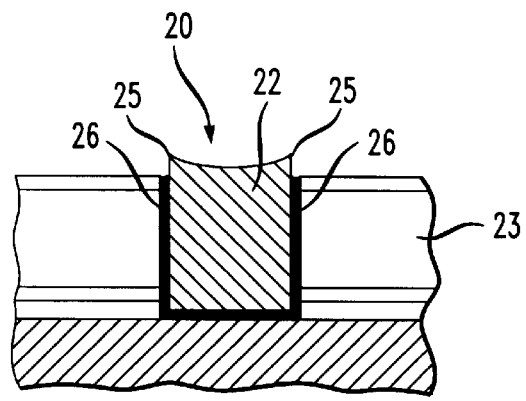
FIGS. 7 and 8 are cross-sectional views of the portion of a single damascene of FIG. 6 manufactured in accordance with one method of the invention.
Figure 8:
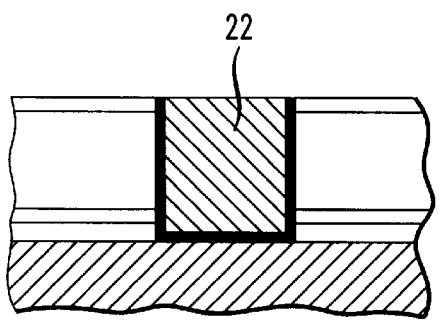

One preferred method of the invention is shown in FIGS. 6, 7 and 8. This method of manufacturing an integrated circuit includes the steps of: (1) providing an apparatus 20 having a plurality of exposed metal-conducting regions 22 adjacent to a plurality of dielectric regions 23, covered at least partially with a barrier material 21, as shown in FIG. 6; (2) subjecting apparatus 20 to a reducing gas to reduce metal oxide on metal-conducting regions 22 to metal; (3) contacting barrier material 21 with $XeF_2$ to remove selected portions of the barrier material 21, as shown from FIGS. 6 to 7; (4) exposing apparatus 20 to a reducing gas to transform residual metal oxide and fluoride to metal at contacted surfaces; and preferably, (5) chemical mechanical polishing, or planarizing, portions 25 of the metal-conducting regions 22 that protrude beyond the adjacent dielectric regions 23 to complete planarization after the barrier material 21 has been removed, as shown from FIGS. 7 to 8. This method may be used to eliminate barrier chemical mechanical polishing of a semiconductor apparatus after chemical mechanical polishing of the metal-conducting region by gasifying the undesired barrier material and to minimize dishing and erosion before dielectric deposition.

Figure 9:
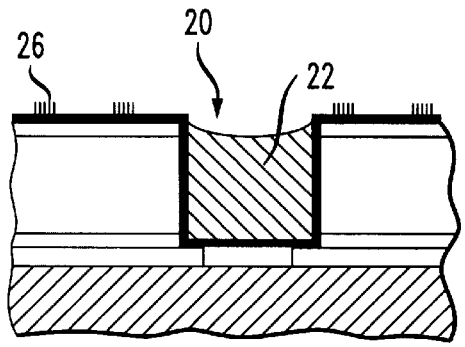
FIG. 9 is a cross-sectional view of the portion of a single damascene of FIG. 6 manufactured in accordance with a variation of the first method of the invention.

A variation of the first method is shown in FIGS. 6 and 9. This method of manufacturing an integrated circuit includes the steps of: (1) providing an apparatus 20 having a plurality of exposed metal-conducting regions 22 and a plurality of dielectric regions 23, covered at least partially with a barrier material 21, wherein said dielectric regions 23 are comprised of SiN or $SiO_2$, and wherein said barrier material 21 comprises $TaSiN_2$, $TiSiN_x$, WSiN, or mixtures thereof, as shown in FIG. 6; (2) polishing selected portions of barrier material 21, leaving residual barrier contamination 26, as shown in FIG. 9; (3) placing the apparatus 20 in a chamber; (4) charging the chamber with inter-halogen gas, rare-gas halide gas, or mixtures thereof, and (5) etching the residual barrier contamination 26 on the apparatus 20. This method may be used to clean a semiconductor apparatus of barrier contamination after barrier chemical mechanical polishing and eliminate leakage between metal conductors in the completed apparatus.

Figure 10:
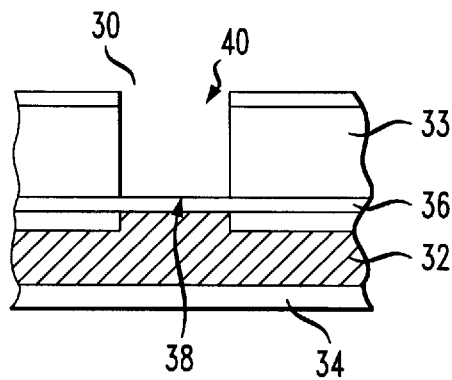
FIGS. 10 and 11 are cross-sectional views of a portion of a single damascene manufactured in accordance with another method of the invention.
Figure 11:
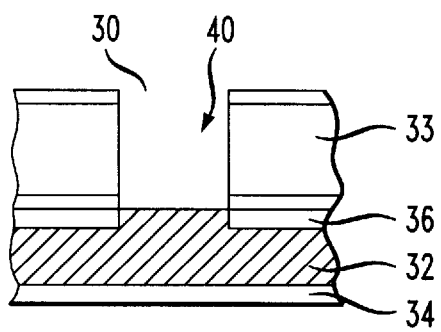

In a second method, as shown in FIGS. 10 and 11, the method of manufacturing an integrated circuit apparatus includes the steps of: (1) providing an apparatus 30 comprising a substrate 34 having a metal-conducting region 32 deposited thereon, an SiN layer 36 deposited above the metal-conducting region 32, and a dielectric region 33, having a via 40 formed therein, deposited on the SiN layer 36, wherein a portion 38 of the SiN layer below the via 40 has a thickness less than about 200 ÅA, as shown in FIG. 10; (2) contacting the SiN layer 38 with inter-halogen gas, rare-gas halide gas, or mixtures thereof to remove the SiN layer 38 and to expose the metal-conducting region 32, thereby avoiding subsequent redeposition of metal from the metal-conducting region 32 onto portions of the dielectric region 33 and preventing electrical leakage in the apparatus 30; and (3) exposing the apparatus 30 to a reducing gas to transform residual metal oxide and fluoride to metal at contacted surfaces. The apparatus 30, after the thin SiN layer 38 has been removed, is shown in FIG. 11.

Figure 12:
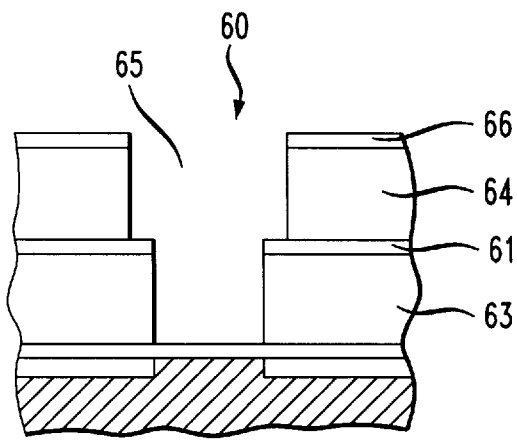
FIG. 12 is a cross-sectional view of a portion of a dual damascene manufactured in accordance with the second method of the invention.

The apparatus 20 provided in the second method is a single damascene structure, but a dual damascene structure 60, as shown in FIG. 12, may also be used. The dual damascene 60 further has an etch mask 61 comprised of $SiO_2$ deposited on the dielectric region 63, a second dielectric region 64, having a trench 65 formed therein, deposited on etch mask 61, and a cap 66 deposited on second dielectric region 64 and comprised of silicon and oxygen, nitrogen, or mixtures thereof In addition, the SiN layer 38 may be provided at a thickness greater than 200ÅA, but must be etched to 200ÅA or less before applying a method of the invention.

It is desirable in the first and second methods that the metal-conducting region 22 in FIGS. 6, 7, 8, and 9 and 32 in FIGS. 10 and 11 is a metal that does not form a volatile fluoride and which is inert to the gas or forms a passivating fluoride layer that can be reduced to the metal. A volatile fluoride is a fluoride with a vapor pressure greater than 0.001 Torr at 26° C. Copper is a particularly preferred conducting metal. However, the metal-conducting region 22 and 32 may also be aluminum or silver. The dielectric region 23 in FIGS. 6, 7, 8 and 9 and 33 in FIGS. 10 and 11 is comprised of a low-k material and may be $SiN_x$, $SiO_2$, fluorinated $SiO_2$, porous oxide material, such as xerogel and aerogel, a material that does not react, or etch, substantially in halogen fluorides or gases that produce atomic F, such as carbon, and carbon alloys containing greater than 20% Si and $O_2$ or greater than 20% fluorine and less than 20% hydrogen. Carbon-based polymeric materials containing N, H, O and unsaturated C bonding are generally unacceptable for safety reasons, except those containing greater than 50% fluorine, which can be used if the interhalogen pressure in the chamber is less than 20 Torr and the wafer temperatures are less than 100° C. Other polymeric materials comprised of carbon, hydrogen, oxygen, or nitrogen can also be used, provided that a lower pressure and temperature are used. The exact conditions will depend on the formulation and reactivity of the polymer.

In the first method, the barrier material 21 in FIG. 6 covering the dielectric region 23 and barrier contamination 26 in FIG. 9 are typically transition metals of groups V and VI, Re, Ru, Pt, and Ir; their binary compositions with Si, Ge, Se, Te, or N; or their ternary compositions with N and Si, Ge, Se, or Te. Particularly preferred are metals or metal compounds, such as Ta, $TaN_x$, $TaSi_x$, $TaSiN_x$, Ti, $TiN_x$, $TiSiN_x$, $TiSi_x$, W, $WSi_x$, $WSiN_x$, $WN_x$, or mixtures thereof Preferably, in the first and second methods, the reducing gas is a plasma containing hydrogen atoms. Ifthe barrier material or exposed copper is oxidized, as is likely following CMP or fluorinated exposure to halogen fluoride gas, the exposure to the reducing plasma should be terminated when the barrier material or copper is depleted of oxygen and fluorine.

In the first method, the gas introduced into the chamber is preferably $XeF_2$. $XeF_2$ is preferred for etching because chlorides attack copper and aluminum, leaving them more volatile or susceptible to corrosion. Use of chloride may cause degradation to copper and aluminum apparatuses. Alternatively, if the hard mask 24 in FIG. 6 is comprised of SiN or $SiO_2$ and the barrier material 21 or barrier contamination 26 in FIG. 9 is comprised of $TaSiN_x$, $TiSiN_x$, or $WSiN_x$, the gas introduced into the chamber may be inter-halogen gas, such as $IF_5$, $IF_7$, $BrF_3$, $BrF_5$, and $ClF_3$, rare-gas fluoride gas, or mixtures thereof The same gases are used in the second method to remove the thin SiN layer 48. Inter-halogens are very reactive and will etch Si, Ta, TaN, TaSiN spontaneously by simply contacting the materials with the inter-halogen gas. $IF_7$ is a particularly preferred inter-halogen gas because it will condense on the surface of the apparatus at a lower vapor pressure. The boiling point of $IF_7$ is 4.8° C. The rate of etching is approximately proportional to the pressure of the gas in the chamber. Inter-halogens will also etch SiN very slowly, but since oxide, low-k material, and copper are not etched, it can be used for cleaning trench and via bottoms of SiN.

In an especially preferred embodiment of the first and second methods, $ClF_3$ is provided at a temperature between about −50° C. and 200° C. $ClF_3$ dissociates on the surface of the apparatus into ClF and F atoms. The chemisorbed F is actually the reacted species that gasifies the barrier material and $SiN_x$ into a volatile species. For example, TaN gasifies into $TaF_5$ and $N_2$ or $NF_3$.

The rate of etching depends upon the material being removed, the pressure of the gas, and the reactor temperature. For example, as shown in Table 1, for $ClF_3$ provided at about 1 Torr and ambient temperature (about 20° C.), the rates and etch times are approximately:

TABLE 1

| Material | Etch Rate | Etching Depth and Time |
| --- | --- | --- |
| Ta | 202 Angstroms/sec | 1,000 Angstroms ≈ 5.0 sec |
| $TaN_x$ | 229 Angstroms/sec | 1,000 Angstroms ≈ 4.4 sec |
| Plasma deposited SiN | 40 Angstroms/min | 200 Angstroms ≈ 5 min |
| Si | 29 Angstroms/sec | 1,000 Angstroms ≈ 34 sec |

If the pressure is changed to about 100 Torr for etching plasma deposited SiN, the rate changes to about 4000 Angstroms/minute and the time to etch 200 Angstroms is about 3seconds. The exposure to the gas, or time requirement of etching, can be a timed exposure, such as about 5 minutes or less, or based on an abrupt change in the area of etching. For the latter case, the gaseous products can be monitored by mass spectrometry, infrared spectrophotometry, absorption ofelectromagnetic radiation by product molecules, downstream microwave discharge that causes light emission from product atoms, pressure changes of the gas in a closed system, quartz-crystal microbalances, gas chromatography, or combinations thereof In most cases, one would look for a step change in intensity of etching products when all SiN or undesired barrier material is removed.

After exposure to $ClF_3$, it is desirable to remove chemisorbed fluorine from exposed surfaces. Exposure to a reducing gas, such as a gas or plasma containing hydrogen atoms, will remove chemisorbed fluorine.

The above steps may be repeated any number of times.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents.

What is claimed is:

1. A method of manufacturing an integrated circuit comprising:

a. providing an apparatus having a plurality ofexposed metal-conducting regions adjacent to a plurality of dielectric regions, covered at least partially with a barrier material;

b. subjecting said apparatus to a reducing gas to reduce metal oxide on said metal-conducting regions to metal;

c. contacting said barrier material with $XeF_2$ to remove selected portions of said barrier material; and d. exposing said apparatus to a reducing gas to transform residual metal oxide and fluoride to metal at contacted surfaces.

2. The method of claim 1 further comprising chemical mechanical polishing portions of said metal-conducting regions that protrude beyond said adjacent dielectric regions to complete planarization after said barrier material has been removed.

3. The method of claim 1 wherein said contacting step is provided for about 5 minutes or less.

4. The method of claim 1 wherein said metal-conducting regions comprise a metal that does not form a volatile fluoride and is inert to said inter-halogen.

5. The method of claim 1 wherein said metal-conducting regions comprise a metal that does not form a volatile fluoride and forms a passivating fluoride layer that can be reduced to said metal.

6. The method of claim 1 wherein said metal-conducting region comprises copper.

7. The method of claim 1 wherein said barrier material comprises a material selected from the group consisting of transition metals of groups V and VI, Re, Ru, Pt, and Ir; binary compositions of said transition metals with atoms selected from the group consisting of Si, Ge, Se, Te, and N; ternary compositions of said transition metals with N and atoms selected from the group consisting of Si, Ge, Se, and Te; and mixtures thereof.

8. The method of claim 1 wherein said dielectric region comprises a material selected from the group consisting of silicone nitride, $SiO_2$, fluorinated $SiO_2$, porous oxide material, carbon alloy, and mixtures thereof.

9. The method of claim 8 wherein said porous oxide material comprises a material selected from the group consisting of aerogel, xerogel, and mixtures thereof.

10. The method of claim 8 wherein said carbon alloy comprises atoms selected from the group consisting of carbon, silicon, hydrogen, oxygen, fluorine, and mixtures thereof.

11. The method of claim 1 wherein said dielectric region comprises a material that does not react substantially in halogen fluorides.

12. The method of claim 1 further comprising a cap comprised of silicon and atoms selected from the groups consisting of oxygen, nitrogen, and mixtures thereof, wherein said dielectric region is at least partially covered by said cap.

13. The method of claim 1 wherein said contacting step is monitored by mass spectrometry, whereby completion of said contacting step is determined by absence of said barrier material.

14. The method of claim 1 wherein said contacting step is monitored by use of a downstream microwave discharge that causes light emission from product atoms, whereby completion of said contacting step is determined by absence of said barrier material.

15. The method of claim 1 wherein said contacting step is monitored by absorption of electromagnetic radiation by product molecules, whereby completion of said contacting step is determined by absence of said barrier material.

16. The method of claim 1 wherein said contacting step is monitored by pressure changes of said gas in a closed system.

17. The method of claim 1 wherein said contacting step is monitored by quartz-crystal microbalances.

18. The method of claim 1 wherein said contacting step is monitored by gas chromatography, whereby completion of said contacting step is determined by absence of said barrier material.

19. The method of claim 1 wherein said contacting step is monitored by infrared spectrophotometry, whereby completion of said contacting step is determined by absence of said barrier material.

20. A semiconductor made by the method of claim 1.

21. A method of manufacturing an integrated circuit comprising:

a. providing an apparatus having a plurality of exposed metal-conducting regions and a plurality of dielectric regions, covered at least partially with a barrier material, wherein said dielectric regions are comprised of a material selected from the group consisting of SiN and $SiO_2$, and wherein said barrier material comprises a material selected from the group consisting of tantalum silicon nitride, titanium silicon nitride, tungsten silicon nitride and mixtures thereof;

b. polishing selected portions of said barrier material, leaving residual barrier contamination;

c. placing said apparatus in a chamber;

d. charging said chamber with a gas selected from the group consisting of inter-halogen gas, rare-gas halide gas, and mixtures thereof; and e. etching said residual barrier contamination on said apparatus.

22. A semiconductor made by the method of claim 21.

23. A method of manufacturing an integrated circuit comprising:

a. providing an apparatus having a surface comprising areas of SiN with underlying copper;

b. etching selected portions of said areas of SiN in a plasma until a thickness of less than 200 ÅA of SiN remains;

c. etching said SiN with $ClF_3$ at a temperature between about 20° C. and 200° C. on said apparatus to expose said copper; and d. exposing said apparatus to a compound selected from the group consisting of plasma containing hydrogen atoms, $H_2SO_4$ solution, and mixtures thereof to transform residual metal oxide and fluoride to metal at contacted surfaces.

24. A semiconductor made by the method of claim 23.

25. A method of manufacturing an integrated circuit apparatus comprising:

a. providing an apparatus comprising a substrate having a metal-conducting region deposited thereon, an SiN layer deposited above said metal-conducting region, and a dielectric region, having a via formed therein, deposited on said SiN layer, wherein a portion of said SiN layer below said via has a thickness less than about 200 ÅA;

b. contacting said SiN layer with a gas selected from the group consisting of inter-halogen gas, rare-gas halide gas, and mixtures thereof to remove said SiN layer and expose said metal-conducting region, thereby avoiding subsequent deposition of metal from said metal-conducting region on portions of said dielectric region and preventing electrical leakage in said apparatus; and c. exposing said apparatus to a reducing gas to transform residual metal oxide and fluoride to metal at contacted surfaces.

26. The method of claim 25 further comprising an etch mask comprised of $SiO_2$ and deposited on said dielectric region; a second dielectric region, having a trench formed therein, deposited on said etch mask; and a cap deposited on said second dielectric region and comprised of silicon and atoms selected from the group consisting of oxygen, nitrogen, and mixtures thereof.

27. The method of claim 25 wherein said inter-halogen gas comprises a gas selected from the group consisting of $IF_5$, $IF_7$, $BrF_3$, $BrF_5$, $ClF_3$, and mixtures thereof.

28. The method of claim 25 wherein said rare-gas halide comprises $XeF_2$.

29. The method of claim 25 wherein said metal-conducting region comprises a metal that does not form a volatile fluoride and forms a passivating fluoride layer that can be reduced to said metal.

30. The method of claim 25 wherein said metal-conducting region comprise copper.

31. The method of claim 25 wherein said dielectric region comprises a material that does not react substantially in halogen fluorides.

32. The method of claim 25 wherein said dielectric region comprises a material selected from the group consisting of $SiO_2$, fluorinated $SiO_2$, porous oxide material, carbon alloy, and mixtures thereof.

33. The method of claim 32 wherein said porous oxide material comprises a material selected from the group consisting of xerogel, aerogel, and mixtures thereof.

34. The method of claim 32 wherein said carbon alloy comprises an atom selected from the group consisting of carbon, silicon, hydrogen, oxygen, fluorine, and mixtures thereof.

35. A semiconductor made by the method of claim 25.

* * * * *

UNITED STATES PATENT AND TRADEMARK OFFICE
CERTIFICATE OF CORRECTION

PATENT NO. : 6,207,570 B1
DATED : March 27, 2001
INVENTOR(S) : John Aaron Mucha

Page 1 of 1

It is certified that error appears in the above-identified patent and that said Letters Patent is hereby corrected as shown below:

<u>Column 4,</u>
Line 60 "200ÅA" to -- 200Å --.

<u>Column 5,</u>
Line 13 "200ÅA" to -- 200Å --.
Line 14 "200ÅA" to -- 200Å --.

Signed and Sealed this

Thirtieth Day of October, 2001

Attest:

*Nicholas P. Godici*

NICHOLAS P. GODICI
*Attesting Officer*     *Acting Director of the United States Patent and Trademark Office*